United States Patent [19]
Grill et al.

[11] Patent Number: 5,942,328
[45] Date of Patent: *Aug. 24, 1999

[54] LOW DIELECTRIC CONSTANT AMORPHOUS FLUORINATED CARBON AND METHOD OF PREPARATION

[75] Inventors: Alfred Grill, White Plains; Vishnubhai Vitthalbhai Patel, Yorktown, both of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/608,893

[22] Filed: Feb. 29, 1996

[51] Int. Cl.$^6$ .................................................. B32B 9/00
[52] U.S. Cl. ............................................ 428/408; 428/195
[58] Field of Search ..................................... 428/408, 195

[56] References Cited

U.S. PATENT DOCUMENTS

| | | | |
|---|---|---|---|
| 4,634,648 | 1/1987 | Jansen et al. | 430/84 |
| 4,847,653 | 7/1989 | Doi et al. | 355/245 |
| 4,851,313 | 7/1989 | Osawa et al. | 430/58 |
| 4,959,261 | 9/1990 | McCullough, Jr. et al. | 428/408 |
| 4,994,337 | 2/1991 | Masaki et al. | 430/67 |
| 5,000,831 | 3/1991 | Osawa et al. | 430/132 |
| 5,073,785 | 12/1991 | Jansen et al. | 427/255.2 |
| 5,162,875 | 11/1992 | Birkle et al. | 257/63 |
| 5,198,263 | 3/1993 | Stafford et al. | 428/408 |
| 5,256,483 | 10/1993 | Yamazaki et al. | 428/408 |
| 5,462,784 | 10/1995 | Grill et al. | 428/336 |
| 5,512,330 | 4/1996 | Dearnaley | 427/249 |
| 5,525,447 | 6/1996 | Ikuno et al. | 430/67 |
| 5,559,367 | 9/1996 | Cohen et al. | 257/77 |
| 5,599,654 | 2/1997 | Kudo | 430/324 |
| 5,601,902 | 2/1997 | Hammerschmidt et al. | 428/209 |
| 5,631,087 | 5/1997 | Fukuda et al. | 428/408 |

*Primary Examiner*—Archene Turner

[57] ABSTRACT

An amorphous fluorinated carbon film for use as a dielectric insulating layer in electrical devices is formed from a fluorinated cyclic hydrocarbon precursor. The precursor may be selected from the group consisting of hexafluorobenzene, 1,2-diethynyltetrafluorobenzene and 1,4-bis(trifluoromethyl) benzene. The film is deposited by a radiation or beam assisted deposition technique such as an ion beam assisted deposition method, a laser assisted deposition method, or a plasma assisted chemical vapor deposition method. The film is thermally stable in non-oxidizing environment at temperatures up to 400° C. and has a low dielectric constant of less than 3.0. The film can be suitably used as an insulator for spacing apart conductors in an interconnect structure.

14 Claims, 1 Drawing Sheet

LOW DIELECTRIC CONSTANT AMORPHOUS FLUORINATED CARBON AND METHOD OF PREPARATION

FIELD OF THE INVENTION

The present invention generally relates to amorphous fluorinated carbon films and method of preparation and more particularly, relates to amorphous fluorinated carbon films that are thermally stable and have low dielectric constants suitable for use as insulating layers in electronic devices and a method of preparation of such films.

BACKGROUND OF THE INVENTION

A semiconductor chip consists of an array of devices whose contacts are interconnected by patterns of metal wiring. For instance, in VLSI chips, the metal patterns are multilayered and are separated by layers of an insulating material which is characterized generally by a low dielectric constant. Interlayer contacts between metal wiring patterns are made by through-holes which are etched through the layers of the insulating material. In a typical chip design, there are one or more wiring layers. Low dielectric constant insulating materials are employed between the wires in the same level and also between the various wiring levels.

In a typical VLSI chip, the insulating material is silicon dioxide that has a dielectric constant of between about 3.9 and about 4.1. As the speed of the chip is affected by the RC value of the insulator, enhanced speed performance requires reduction of the capacitance (C). The quest for higher integration in the chip results in the shrinkage of the dimension and tends to increase the capacitance values, unless the dielectric constant of the insulator is significantly reduced. Furthermore, with the increasing use of large scale integration in the chip design, back end wiring densities are increasing. As the wiring density increases, the need for lower dielectric constant insulating materials, i.e. interlayer dielectric (ILD) materials arises in order to improve the performance of the VLSI and ULSI devices.

Different materials that have low dielectric constants have been investigated as potential replacement materials for silicon dioxide. For instance, among the candidate materials for the ILD, fluorinated carbon polymers appear to have the lowest dielectric constant values, i.e., <3. However, most of the materials with significantly lower dielectric constants such as those of fluoropolymers are thermally unstable at chip processing temperatures above 350° C., thus making them unsuitable for integration in modern semiconductor fabrication technology. A thermal endurance at processing temperatures higher than 400° C. after the deposition of the BEOL dielectric is frequently required in such technology.

It is therefore an object of the present invention to provide a low dielectric constant insulating material for use as a dielectric insulating layer in electronic devices that does not have the drawbacks and shortcomings of the prior art dielectric materials.

It is another object of the present invention to provide a low dielectric constant material for use as a dielectric insulating layer in electronic devices that is thermally stable at semiconductor processing temperatures.

It is a further object of the present invention to provide a low dielectric constant insulating material for use as a dielectric insulating layer in semiconductor devices that is thermally stable in non-oxidizing environment at temperatures up to 400° C.

It is another further object of the present invention to provide a low dielectric constant insulating material for use as a dielectric insulating material in both interlayer applications and intralayer applications in a semiconductor device that is thermally stable in non-oxidizing environment.

It is still another object of the present invention to provide a low dielectric constant insulating material for use as a dielectric insulating layer in semiconductor devices that has a dielectric constant of less than 3.0.

It is another further object of the present invention to provide a low dielectric constant insulator for spacing apart one or more levels of conductors in a semiconductor device.

It is still another further object of the present invention to provide a low dielectric constant amorphous fluorinated carbon material for use as a dielectric insulating layer in semiconductor devices that can be formed from a fluorinated cyclic hydrocarbon precursor.

It is yet another further object of the present invention to provide a low dielectric constant amorphous fluorinated carbon material for use as a dielectric insulating layer in semiconductor devices that can be formed from a fluorinated cyclic hydrocarbon precursor such as hexafluorobenzene, 1,2-diethynyltetrafluorobenzene or 1,4-bis(trifluoromethyl) benzene.

It is yet another further object of the present invention to provide a low dielectric constant amorphous fluorinated carbon material for use as a dielectric insulating layer in VLSI or ULSI devices that can be deposited by a radiation or beam assisted deposition technique.

SUMMARY OF THE INVENTION

In accordance with the present invention, an amorphous fluorinated carbon film for use as a dielectric insulating layer in semiconductor devices formed from a fluorinated cyclic hydrocarbon precursor and a method of preparation are provided.

In the preferred embodiment, the amorphous fluorinated carbon film for use as a dielectric insulating layer is formed from a precursor selected from the group consisting of hexafluorobenzene, 1,2-diethynyltetrafluorobenzene and 1,4-bis(trifluoromethyl) benzene. The film is prepared by a radiation or beam assisted deposition technique such as an ion beam assisted method, a laser assisted deposition method or a plasma assisted chemical vapor deposition method. The film deposited is thermally stable in non-oxidizing environment at temperatures up to 400° C. and has a dielectric constant of less than 3.0. The film can be used as an interconnect dielectric layer in an electronic device, for instance, as an insulator for spacing apart conductors in an interconnect structure.

In an alternate embodiment, the amorphous fluorinated carbon film is deposited on an intermediate non-fluorinated diamond-like carbon layer or between two non-fluorinated diamond-like carbon layers.

In another alternate embodiment, an additional graded layer is deposited between the fluorinated carbon layer and the non-fluorinated diamond-like carbon layer.

The present invention is also directed to an insulator used for spacing apart one or more levels of conductors in a semiconductor device which includes a substrate that has a top surface with an exposed first layer of metal, an insulator layer of amorphous fluorinated carbon formed from a fluorinated cyclic hydrocarbon precursor, and a second layer of metal that is patterned to form a plurality of conductors on the insulator layer. The substrate may also have an upper surface with an exposed first area of metal and an exposed second area of an insulating material. The second area of insulating material is used for intra-level insulation purpose. The insulator may further include a graded layer between the fluorinated carbon layer and the non-fluorinated diamond-like carbon layer to improve the adhesion between the two dielectric layers. A continuous transition is provided by the graded layer between the two dielectric layers.

The present invention is further directed to an interconnect structure for use in a semiconductor device that includes a substrate, a first layer of an electrically conductive material deposited on the surface of the substrate, a layer of an amorphous fluorinated carbon deposited on top of the first layer of electrically conductive material from a fluorinated cyclic hydrocarbon precursor, a second layer of an electrically conductive material deposited on the amorphous fluorinated carbon layer, and a metal stud connecting the first layer of electrically conductive material to the second layer of electrically conductive material. The first and the second electrically conductive material can be aluminum, copper, tungsten, tantalum, titanium, their alloys and conductive metal nitrides. The layer of the amorphous fluorinated carbon has a low dielectric constant of smaller than 3.0 and some layers have a dielectric constant smaller than 2.8. It is thermally stable in a non-oxidizing environment at temperatures up to 400° C. In one alternate embodiment, the layer of the fluorinated carbon is deposited on an intermediate non-fluorinated diamond-like carbon layer or between two non-fluorinated diamond-like carbon layers. In another alternate embodiment, the interconnect structure also include a graded layer between the fluorinated carbon layer and the non-fluorinated diamond-like carbon layer.

BRIEF DESCRIPTION OF THE DRAWINGS

Other object, features, and advantages of the present invention will become apparent upon consideration of the specification and the appended drawings in which.

DETAILED DESCRIPTION OF THE PREFERRED AND THE ALTERNATE EMBODIMENTS

Figure 1:
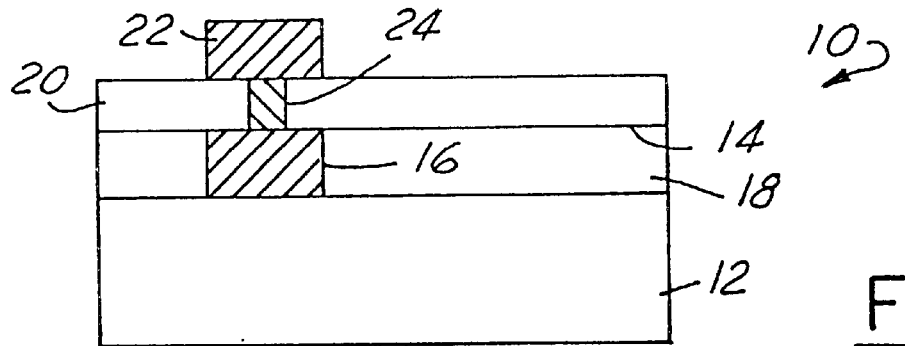
FIG. 1 is an enlarged cross-sectional view of a semiconductor device which contains an amorphous fluorinated carbon layer as in insulating layer for spacing apart two levels of metalization in a semiconductor device.

The present invention provides an amorphous fluorinated carbon film for use as a dielectric insulating layer in electronic devices formed from a fluorinated cyclic hydrocarbon precursor and a method for such preparation.

The present invention discloses a method of preparation of novel low dielectric constant materials of high thermal stability that are suitable as dielectrics in VLSI and ULSI interconnects. According to the invention, thermally stable materials of amorphous fluorinated carbon (a-F:C) films are prepared from fluorinated cyclic hydrocarbons using radiation or beam assisted techniques such as ion beam assisted deposition, laser assisted deposition or plasma assisted chemical vapor deposition (PACVD). The more preferred method is PACVD which allows the uniform deposition of the low-epsilon material over a large area. Typical precursor materials for the preparation of the amorphous fluorinated carbon films are hexafluorobenzene ($C_6F_6$), 1,2-diethynyltetrafluorobenzene ($C_6F_4(C_2H)_2$), and 1,4-bis (trifluoromethyl) benzene ($C_6H_4(CF_3)_2$).

The films and their method of preparation are suitable for integration in the semiconductor fabrication technology. The films can be deposited uniformly over large areas by radio frequency or DC PACVD, preferably on negatively biased substrates. The substrate temperature can be set at between room temperature and 250° C. The crosslinked films thus prepared have low dielectric constants, have no structural anisotropy, and are characterized by high electrical resistivity and chemical inertness.

In a typical PACVD process, a semiconductor device is first loaded into a parallel plate plasma reactor and electrically connected to become one of the electrodes. After the reactor is pumped to a preset negative pressure, a suitable mixture of reactant gases of fluorinated cyclic hydrocarbon vapors and hydrogen is flown into the reactor, while the pressure inside the reactor is maintained at a preset value in the range between about 30 m Torr and about 300 m Torr. A DC or RF power is then applied to the electrodes of the reactor to ignite a plasma such that the device to be coated becomes negatively biased relative to ground or to other parts of the reactor. The device is kept in the plasma until the required thickness of coating is obtained. A desirable coating thickness is in the range between about 0.3 $\mu$m and about 1.5 $\mu$m per layer.

EXAMPLE 1

One example of depositing a-F:C films on an eight inch wafer is to use a parallel plate RF PACVD system and hexafluorobenzene as the precursor under the following chamber conditions:

Flow Rate=10 sccm

Pressure=30 m Torr

Substrate bias=−100 V D C

RF power=25 W

Substrate temperature=180° C.

An amorphous fluorinated carbon film of 1 $\mu$m thickness is obtained after a deposition time of 20 minutes.

EXAMPLE 2

Another example of depositing a-F:C films on an eight inch wafer is to use a parallel plate DC PACVD system and hexafluorobenzene as the precursor under the following chamber conditions:

Flow Rate=20 sccm

Pressure=100 m Torr

Substrate bias=−500 V D C or −800 V D C

DC Power density=0.1 W $CM^{-2}$

Substrate Temperature=250° C.

An amorphous fluorinated carbon film of 1 $\mu$m thickness is obtained after a deposition time of 20 minutes.

The films deposited have a dielectric constant of $\leq 2.8$ and are thermally stable in vacuum or helium for at least four hours at 400° C. The films contain fluorine in a concentration range between about 22 and about 42 atomic percent. The amorphous fluorinated carbon film can be patterned for vias and/or planarized by using an oxygen reactive ion etching technique. The films are therefore suitable for use as isotropic low dielectric constant insulators in integrated electronic devices or packaging, for instance, as back end structures for contact to CMOS devices. The present invention novel amorphous fluorinated carbon films can also be utilized in an interconnect structure as the insulating layers. The interconnect structure normally includes a substrate that has an upper surface with an exposed first area of a metal and an exposed second area of an insulating material, a first layer of amorphous fluorinated carbon material formed on the upper surface of the substrate, a second layer of metal patterned to form a plurality of conductors on top of the fluorinated carbon layer, and a metal stud electrically connecting selected first areas to one or more of the plurality of conductors.

An integrated semiconductor device as described above is shown in FIG. 1. The integrated semiconductor device 10 includes a substrate 12 which has an upper surface 14 including an exposed first area of metal 16 and an exposed second area of insulating material 18. A layer of fluorinated carbon material 20 is deposited on the upper surface of the substrate 14. A metal stud 24 is formed through the fluorinated carbon layer 20 to connect the exposed first area 16 to a second metal layer 22 which is subsequently formed. Suitable metals that can be used in the present invention interconnect structure include Al, Cu, W, Ti, Ta, alloys thereof and conductive metal nitrides. The metal can be deposited using a sputtering or a chemical vapor deposition technique.

In the amorphous fluorinated carbon film, it may be desirable to contain a small amount of hydrogen in the concentration range between about 0 and about 20 atomic percent, and preferably between about 0 and about 5 atomic percent. It has been discovered that such a small amount of hydrogen improves the strength of the films. The total content of hydrogen should be limited, however, since the dielectric constant of the film generally increases with the hydrogen content.

Figure 2:
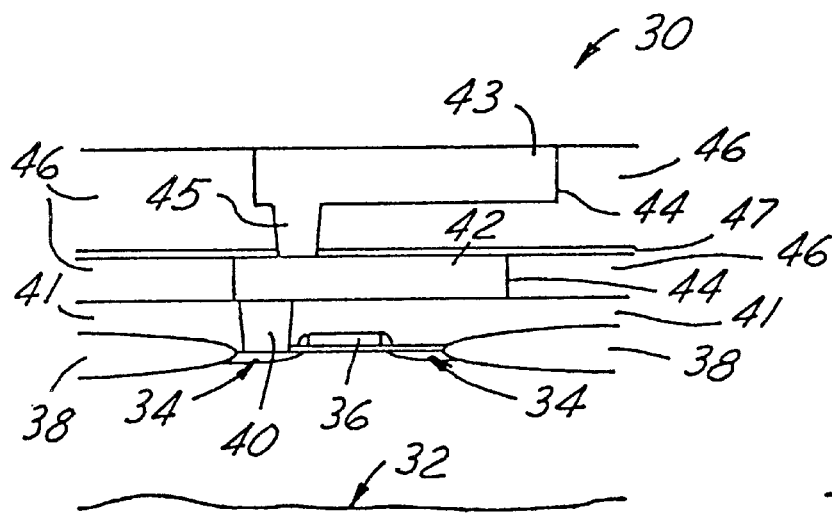
FIG. 2 is an enlarged cross-sectional view of a Field Effect Transistor of a CMOS structure which contains amorphous fluorinated carbon films as a first and a second dielectric insulating layer.
Figure 3:
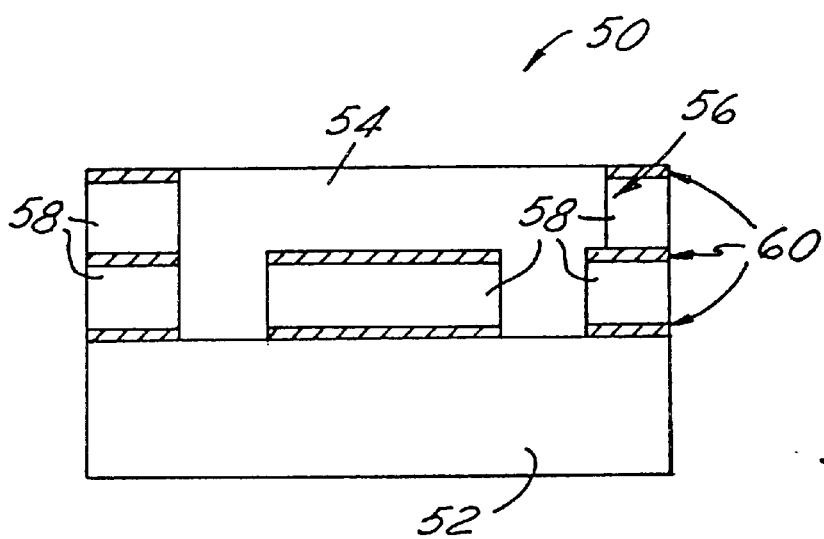
FIG. 3 is an enlarged cross-sectional view of an ULSI interconnect structure of the present invention which contains amorphous fluorinated carbon films used as the inter-level and the intralevel dielectric layer.

A second example of application of the present invention amorphous fluorinated carbon film is shown in FIG. 2 in a field effect transistor or FET. The FET contains an insulator for spacing apart one or more levels of conductors in an integrated circuit chip. FIG. 3 shows a FET device 30 which includes a substrate 32 that has implanted source and drain regions 34, a polycrystalline silicon gate region 36 and recessed oxide regions 38. The FET device 30 further includes a CVD W trench fills 40, a passivating layer of silicon dioxide or silicon nitride 41, copper, aluminum or tungsten interconnects 42 and 43, a metal liner of Ti, Ta, W or compounds or alloys thereof 44, an interlevel via filled with W, Al or Cu 45, a fluorinated carbon layer 46, and a capping layer of fluorinated carbon material, silicon dioxide, silicon nitride, boron nitride or compound thereof 47. The fluorinated carbon layer 46 of the FET device 30 acts as an insulator for spacing apart contact levels 42 and 43 of the FET device. The fluorinated carbon insulator has a low dielectric constant which is uniform in all directions. The fluorinated carbon insulator taught by the present invention therefore presents a significant improvement over prior art insulators.

A third example of application of the present invention amorphous fluorinated carbon film is illustrated in FIG. 3 in an ULSI interconnect structure. The ULSI interconnect structure 50 includes a substrate 52, Cu interconnects and studs 54, a Ta liner 56, fluorinated carbon interlevel and intralevel dielectric layers 58, a Si-doped fluorinated carbon or Si-doped non-fluorinated diamond-like carbon RIE stop, and a barrier layer 60. It should be noted that the layer of amorphous fluorinated carbon film can be formed on an intermediate non-fluorinated diamond-like carbon layer, or formed between two non-fluorinated diamond-like carbon layers. The interconnect structure may further include a graded layer between the fluorinated carbon layer and the non-fluorinated diamond-like carbon layer. The use of the graded layer is to improve the adhesion between the two dielectric layers by providing a continuous transition between the two layers.

While the present invention has been described in an illustrative manner, it should be understood that the terminology used is intended to be in a nature of words of description rather than of limitation.

Furthermore, while the present invention has been described in terms of a preferred and several alternate embodiments thereof, it is to be appreciated that those skilled in the art will readily apply these teachings to other possible variations of the invention. For instance, other layered structures of the fluorinated carbon films and the non-fluorinated diamond-like films may be used and further, other coating methods may be employed to deposit the films while substantially achieve the same desirable results of the present inventions.

The embodiments of the invention in which an exclusive property or privilege is claimed are defined as follows:

1. An amorphous fluorinated carbon film formed from a fluorinated cyclic hydrocarbon precursor comprising fluorine in a concentration range between about 22 and about 42 atomic percent.

2. An amorphous fluorinated carbon film according to claim 1, wherein said fluorinated cyclic hydrocarbon is selected from the group consisting of hexafluorobenzene, 1,2-diethynyltetrafluorobenzene and 1,4-bis (trifluoromethyl) benzene.

3. An amorphous fluorinated carbon film according to claim 1, wherein said film is formed by a radiation or beam assisted deposition technique.

4. An amorphous fluorinated carbon film according to claim 1, wherein said film is formed by a technique selected from the group consisting of an ion beam assisted deposition technique, a laser assisted deposition technique and a plasma assisted chemical vapor deposition technique.

5. An amorphous fluorinated carbon film according to claim 1, wherein said film is thermally stable in non-oxidizing environment at temperatures up to 400° C.

6. An amorphous fluorinated carbon film according to claim 1, wherein said film has a dielectric constant of less than 3.0.

7. An amorphous fluorinated carbon film according to claim 1, wherein said film is used as an interconnect dielectric layer in an electronic device.

8. A cross linked amorphous fluorinated carbon film formed from a fluorinated cyclic hydrocarbon precursor comprising fluorine in a concentration range between about 22 and about 42 atomic percent.

9. An amorphous fluorinated carbon film according to claim 8, wherein said fluorinated cyclic hydrocarbon is selected from the group consisting of hexafluorobenzene, 1,2-diethynyltetrafluorobenzene and 1,4-bis (trifluoromethyl) benzene.

10. An amorphous fluorinated carbon film according to claim 8, wherein said film is formed by a radiation or beam assisted deposition technique.

11. An amorphous fluorinated carbon film according to claim 8, wherein said film is formed by a technique selected from the group consisting of an ion beam assisted deposition technique, a laser assisted deposition technique and a plasma assisted chemical vapor deposition technique such as plasma enhanced chemical vapor deposition or high density plasma.

12. An amorphous fluorinated carbon film according to claim 8, wherein said film is thermally stable in non-oxidizing environment at temperatures up to 400° C.

13. An amorphous fluorinated carbon film according to claim 8, wherein said film has a dielectric constant of less than 3.0.

14. An amorphous fluorinated carbon film according to claim 8, wherein said film is used as an interconnect dielectric layer in an electronic device.

* * * * *